United States Patent
Hasan et al.

(10) Patent No.: US 8,635,033 B2
(45) Date of Patent: Jan. 21, 2014

(54) METHOD AND APPARATUS TO MONITOR LOSS OF GROUND ISOLATION OF AN ELECTRIC MOTOR DRIVE CIRCUIT

(75) Inventors: S. M. Nayeem Hasan, Novi, MI (US); David P. Tasky, Farmington Hills, MI (US); Mohammad N. Anwar, Van Buren Township, MI (US); Wei D. Wang, Troy, MI (US)

(73) Assignee: GM Global Technology Operations LLC, Detroit, MI (US)

(*) Notice: Subject to any disclaimer, the term of this patent is extended or adjusted under 35 U.S.C. 154(b) by 992 days.

(21) Appl. No.: 12/718,016

(22) Filed: Mar. 5, 2010

(65) Prior Publication Data

US 2011/0218745 A1 Sep. 8, 2011

(51) Int. Cl.
*G01R 31/02* (2006.01)
*G06F 19/00* (2011.01)

(52) U.S. Cl.
USPC ................. 702/58; 324/509; 361/42

(58) Field of Classification Search
USPC .......... 702/57–59, 63–65, 185; 324/500, 503, 324/509, 512, 522, 525, 555, 76.11; 340/650; 361/42
See application file for complete search history.

(56) References Cited

U.S. PATENT DOCUMENTS

| | | | |
|---|---|---|---|
| 5,877,926 A | 3/1999 | Moisin | |
| 7,253,584 B2 | 8/2007 | Souther et al. | |
| 7,459,914 B2 * | 12/2008 | Lindsey et al. | 324/525 |
| 7,852,089 B2 * | 12/2010 | Acena et al. | 324/503 |
| 2006/0220774 A1 | 10/2006 | Skendzic | |
| 2009/0184717 A1 | 7/2009 | Ivan et al. | |

* cited by examiner

Primary Examiner — Manuel L Barbee

(57) ABSTRACT

A method for monitoring electric isolation of a high voltage DC bus to detect ground isolation faults includes monitoring voltage differentials between a positive DC electric power bus and a negative DC electric power bus and a chassis ground. Electrical isolation between each of the positive and negative DC electric power buses and the chassis ground is monitored using a ratio of the voltage differentials.

16 Claims, 3 Drawing Sheets

METHOD AND APPARATUS TO MONITOR LOSS OF GROUND ISOLATION OF AN ELECTRIC MOTOR DRIVE CIRCUIT

TECHNICAL FIELD

This disclosure is related to electric motor control circuits, and more specifically to monitoring loss of ground isolation in a high voltage DC bus of an electric motor control circuit.

BACKGROUND

The statements in this section merely provide background information related to the present disclosure and may not constitute prior art.

Hybrid and electric vehicle systems use high voltage systems that provide electric power for traction motors and other electric machines. A high voltage system includes a high voltage DC electric power source, e.g., a battery that electrically connects to the traction motor via a power inverter. The power inverter converts DC electric power to AC electric power to drive the traction motor, and preferably converts AC electric power to DC electric power for charging the battery. The high voltage DC electric power source electrically connects to the power inverter via a positive high-voltage bus (HV+) and a negative high-voltage bus (HV−). The other electric machines using high voltage power are also electrically connected to the positive high-voltage bus and the negative high-voltage bus. The positive high-voltage bus and the negative high-voltage bus are electrically isolated from a chassis ground.

Electric machines, e.g., traction motors, include rotors that rotate in response to alternating current (AC) electric power applied to associated stators. The rotors can be mechanically coupled to power transmission devices to provide tractive power to a driveline of a vehicle.

Known voltage source inverter circuits and associated control circuits can convert direct current (DC) electric power originating from a high-voltage energy storage device to alternating current (AC) electric power to generate tractive power in response to operator requests. Known inverter circuits include MOSFET and IGBT switch devices. Electric load requirements can include presently occurring electric loads and battery charging to meet future electric loads.

A voltage source inverter uses a floating DC bus setup wherein the DC input voltages are configured to float with reference to a chassis ground. This floating can be controlled by using balanced high impedance resistors that connect high voltage DC buses to the chassis ground. Capacitors can be electrically connected in parallel with the high impedance resistors to provide low impedance shunt paths for high frequency electric noise currents. In one embodiment, half the DC bus voltage is applied across a positive electric power bus (HV+) to the chassis ground, and half the DC bus voltage is applied across a negative electric power bus (HV−) to the chassis ground. An AC side of the voltage source inverter floats with reference to the chassis ground.

There are two potential faults associated with loss of ground isolation. One fault is an AC loss of isolation, wherein one of the phases of the AC side is shorted to chassis ground. Another fault is a DC loss of isolation wherein one of the positive electric power bus (HV+) and the negative electric power bus (HV−) is shorted to the chassis ground or has a reduced impedance relative to the chassis ground. When an AC loss of isolation fault occurs on one of the phases of the AC side of the voltage source inverter, AC current associated with activation and deactivation of the switch devices of the inverter flows through the capacitors that provide the low impedance shunt paths for high frequency electric noise currents. In the event of a ground isolation fault, AC current associated with one of the phase voltages of the inverters from the positive electric power bus (HV+) to the negative electric power bus (HV−) can cause excessive electric current flow to the capacitors that provide the low impedance shunt paths for high frequency electric noise currents. AC current in excess of the capacity of the capacitors can cause capacitor faults and associated inverter damage.

A known solution to detect an AC loss of isolation fault includes measuring electric current through each of the electric cables associated with the phases of the AC side of the voltage source inverter and arithmetically summing them. In an ideal system operating without a fault, the sum of the measured electric currents is zero at any selected point in time. When a ground isolation fault is present, the sum of the measured electric currents is a value other than zero. Issues associated with this solution include measurement errors associated with signal outputs from the electric current sensing devices, which can be cumulative. This can cause an error in the overall current signal. Furthermore, a phase current sensor can have bandwidth/step response limitations due to magnetic and electrical response characteristics and sensor saturation. Thus a fault may not be detected depending on the timing of the sample measurement in relation to switching events associated with the inverter. Furthermore, a ground isolation fault and associated change in impedance can include a resonance element, with data sampling occurring at or near a zero crossing. Thus, any fault current may be aliased out. Furthermore, when impedance approaches zero, any current oscillation may be dampened out in less than the sampling time. Thus the fault current may not be measured.

A known solution to detect DC loss of isolation includes measuring voltage between the positive electric power bus (HV+) and the negative electric power bus (HV−), and measuring voltage between the negative electric power bus (HV−) and the chassis ground, and calculating a voltage ratio based thereon. One calculation for the voltage ratio for loss of isolation detection is 2*(voltage measurement between HV− to chassis ground)/(voltage measurement between HV+ to HV−). Issues associated with this known solution include signal measurement errors that need to be accounted for and are often cumulative. The effect of signal measurement errors is that there can be a lack of separation between a "must detect" and a "must not detect" threshold, which can lead to false fault detection. Furthermore, known DC voltage sensors can have bandwidth and response time measurement limitations. Thus a fault may not be detected. Furthermore, the timing of the measurement sample relative to a fault and an associated switching event may result in a fault not being recorded. Furthermore, fault impedance may include a resonance element, with data sampling occurring at or near the zero crossing. Thus, a fault current may be aliased out. Furthermore, when a switching period associated with the inverter is near a 50% duty cycle, an average voltage may still be near an expected level. Thus, a fault voltage may not be measured.

SUMMARY

A method for monitoring electrical isolation of a DC electrical power circuit relative to a chassis ground includes monitoring a first electrical potential including a voltage differential between a positive DC electric power bus and a negative DC electric power bus, monitoring a second electrical potential including a voltage differential between the positive DC electric power bus and the chassis ground, monitoring a third electrical potential including a voltage differential between the negative DC electric power bus and the chassis ground, calculating a first voltage ratio including a ratiometric comparison of the third electrical potential to the second electrical potential, monitoring electrical isolation between the positive DC electric power bus and the chassis ground based upon the first voltage ratio, and monitoring electrical isolation between the negative DC electric power bus and the chassis ground in relation to the first voltage ratio and the first electrical potential.

BRIEF DESCRIPTION OF THE DRAWINGS

One or more embodiments will now be described, by way of example, with reference to the accompanying drawings, in which.

DETAILED DESCRIPTION

Figure 1:
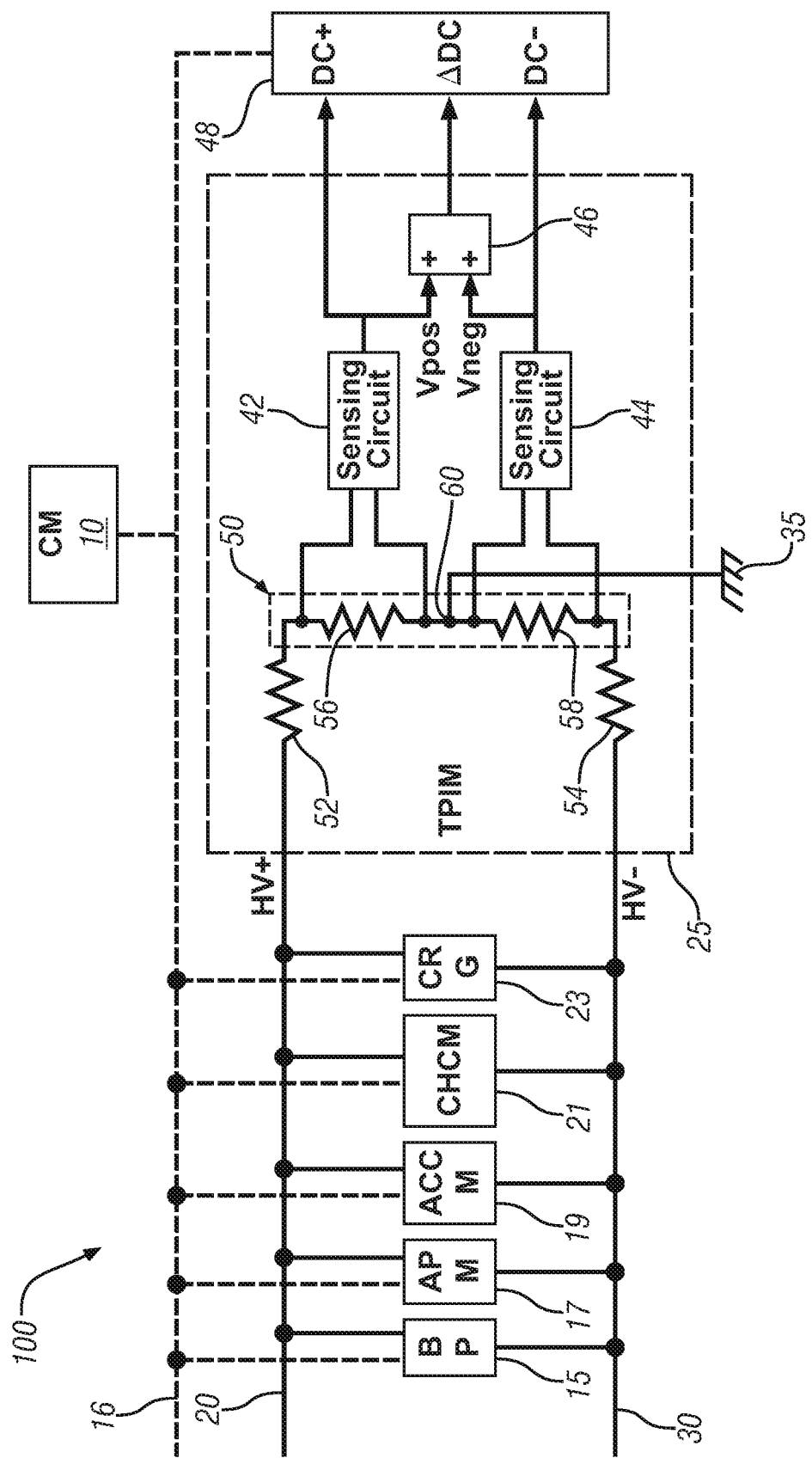
FIG. 1 schematically illustrates a high-voltage electrical circuit including a positive DC electric power bus (HV+) and a negative DC electric power bus (HV−) configured to transfer high-voltage DC electric power between a high-voltage energy storage device and a plurality of electric devices in accordance with the present disclosure.

Referring now to the drawings, wherein the showings are for the purpose of illustrating certain exemplary embodiments only and not for the purpose of limiting the same, FIG. 1 schematically illustrates a high-voltage electrical circuit 100 including a positive DC electric power bus 20 (HV+) and a negative DC electric power bus 30 (HV−) configured to transfer high-voltage DC electric power between a high-voltage energy storage device or battery pack (BP) 15 and a plurality of electric devices. The electric devices include an inverter module (TPIM) 25 that operates to convert the high-voltage DC electric power to high-voltage AC electric power that is transferred to a multiphase electric machine. In one embodiment the multiphase electric machine is a multiphase synchronous AC machine including a stator and a rotor magnetically coupled to the stator. In one embodiment the multiphase electric machine is configured to generate torque that is transferred via a rotor to a driveline for a vehicle to generate tractive torque for vehicle propulsion. One understands that the description of the application is illustrative, and the disclosure is not restricted thereto.

By way of example not intended to limit the scope of the disclosure, other electric devices that electrically connect between the positive DC electric power bus 20 and the negative DC electric power bus 30 include an auxiliary power module (APM) 17, an air conditioning compressor module (ACCM) 19, an electrical heating module (CHCM) 21 and a charging module (CRG) 23. A control module (CM) 10 is signally and operatively connected to each of the electric devices including the inverter module 25 via a high-speed communications bus 16 that is configured to form a local area network. The positive DC electric power bus 20, the negative DC electric power bus 30, the inverter module 25, and the aforementioned electric devices are each electrically isolated from a chassis ground 35. It is understood that electrical isolation of an electric device can refer to an electric device having a high impedance between the positive DC electric power bus 20, the negative DC electric power bus 30 and the chassis ground 35.

It should be appreciated that the inverter module 25 includes an inverter circuit that electrically connects to each of the phases of the multiphase electric machine. The inverter circuit includes a plurality of pairs of switch devices associated with corresponding phases of the multiphase electric machine. Each of the switch devices preferably is a semiconductor device having low-on impedance, e.g., in an order of magnitude of milli-Ohms. The pairs of switch devices are configured to control electric power flow between the positive DC electric power bus 20, one of the phases of the multiphase electric machine and the negative DC electric power bus 30. A switch control circuit controls activation and deactivation of each of the switch devices.

The inverter module 25 electrically connects to the positive DC electric power bus 20 and the negative DC electric power bus 30. The inverter module 25 includes a resistor shunt circuit 50 for monitoring DC voltage potentials across the positive DC electric power bus 20 and the negative DC electric power bus 30. The resistor shunt circuit 50 includes first and second sensing resistors 56 and 58 that are electrically connected in series between the positive DC electric power bus 20 and the negative DC electric power bus 30, taking into account high-impedance internal isolation resistance thereof, which is depicted as resistance elements 52 and 54. A junction 60 between the first and second sensing resistors 56 and 58 is electrically connected to the chassis ground 35.

The high-voltage energy storage device 15 electrically connects to the positive DC electric power bus 20 and the negative DC electric power bus 30 such that the DC input voltages float with reference to the chassis ground 35. Preferably, half the DC bus voltage is applied across the positive DC electric power bus 20 to the chassis ground 35, and half the DC bus voltage is applied across the negative DC electric power bus 30 to the chassis ground 35.

The inverter module 25 includes a first voltage sensing circuit 42 for monitoring voltage across the first sensing resistor 56, which is indicative of the voltage between the positive DC electric power bus 20 and the chassis ground 35 (DC+). The inverter module 25 includes a second voltage sensing circuit 44 for monitoring voltage across the second sensing resistor 58, which is indicative of the voltage between the negative DC electric power bus 30 and the chassis ground 35 (DC−). The inverter module 25 includes a summing circuit 46 for summing the voltages across the first and second sensing resistors 56 and 58, which is indicative of the voltage between the positive DC electric power bus 20 and the negative DC electric power bus 30 ($\Delta$DC). The voltage between the positive DC electric power bus 20 and the chassis ground 35 (DC+), the voltage between the negative DC electric power bus 30 and the chassis ground 35 (DC−), and the voltage between the positive DC electric power bus 20 and the negative DC electric power bus 30 ($\Delta$DC) are periodically monitored by an analog/digital converter 48 which is signally connected via the high-speed communications bus 16 to the control module 10. Preferably the aforementioned analog voltages of DC+, DC−, and $\Delta$DC are subjected to low-pass filtering implemented in hardware to eliminate measurement errors related to aliasing, resonance and inverter switching frequency, and are periodically digitally sampled using the analog/digital circuit 48 during ongoing operation, in one embodiment at inverter PWM switching frequency (e.g., 0.1 msec for a 10 kHz switching).

Control module, module, controller, processor and similar terms mean any suitable one or various combinations of one or more Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The control module has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, algorithms may be executed in response to occurrence of an event.

Figure 2:
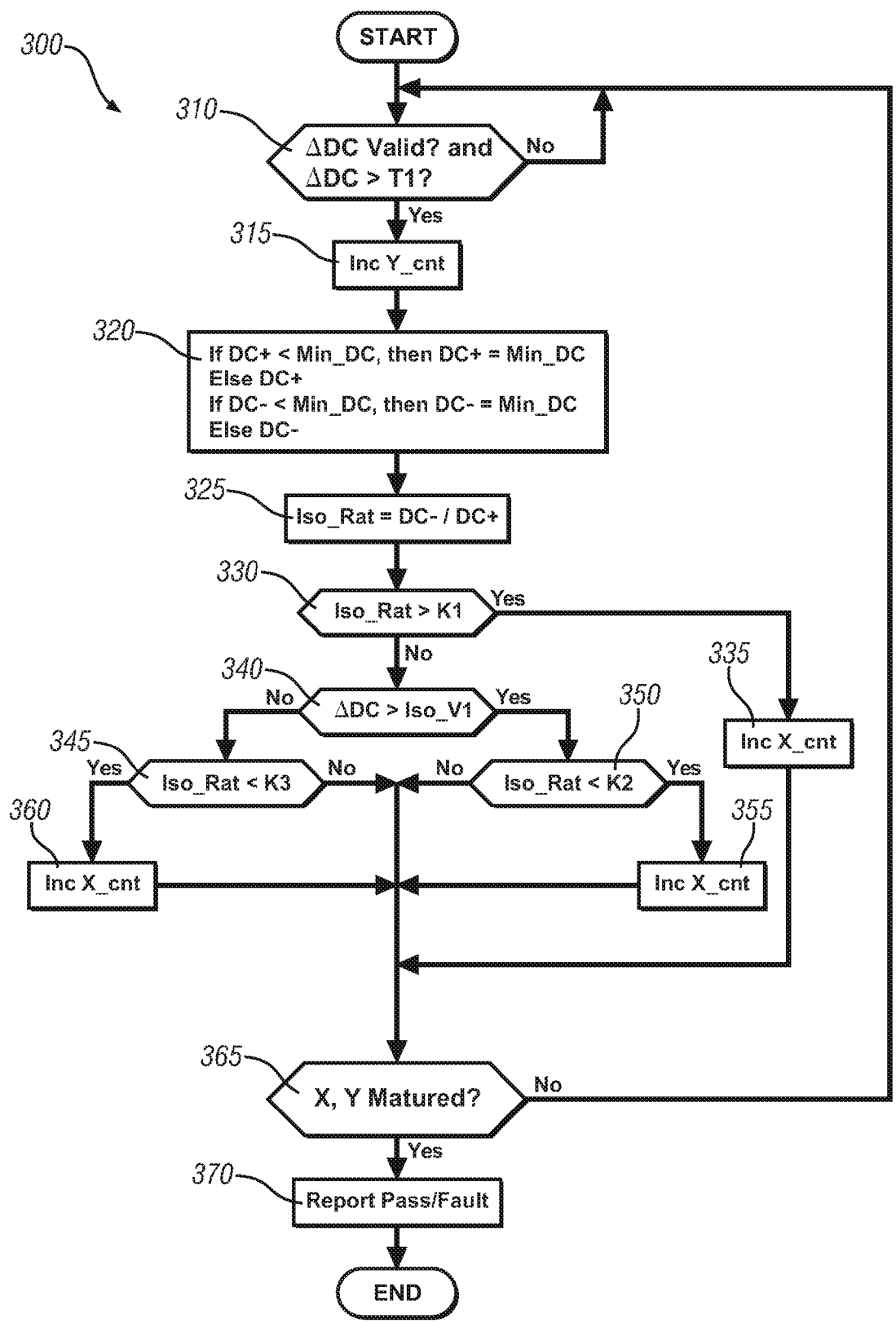
FIG. 2 illustrates a flowchart for a process to monitor the positive DC electric power bus (HV+) and the negative DC electric power bus (HV−) to detect a fault associated with loss of electric ground isolation in accordance with the present disclosure.

FIG. 2 shows a process 300 for monitoring the positive DC electric power bus 20 and the negative DC electric power bus 30 to detect a fault associated with loss of electric ground isolation. The process 300 is preferably executed as one or more algorithms in the control module 10, or as an application-specific integrated circuit (ASIC), or other suitable means. In operation, the first and second voltage sensing circuits 42 and 44 and the summing circuit 46 monitor the voltage differential between the positive DC electric power bus 20 and the chassis ground 35 (DC+), the voltage differential between the negative DC electric power bus 30 and the chassis ground 35 (DC−), and the voltage differential between the positive DC electric power bus 20 and the negative DC electric power bus 30 ($\Delta$DC).

Initially, the voltage differential between the positive DC electric power bus 20 and the negative DC electric power bus 30 ($\Delta$DC) is evaluated to determine that it is a valid voltage level to conduct an isolation check, and that it is greater than a threshold T1 (310). The voltage differential between the positive DC electric power bus 20 and the negative DC electric power bus 30 ($\Delta$DC) is said to be valid when it is within an allowable range, e.g., between 0 V and 550 V when the nominal voltage level output from the battery pack (BP) 15 across the positive DC electric power bus 20 and the negative DC electric power bus 30 is 360 V. The threshold T1 is a minimum voltage differential, in one embodiment 50V. If the voltage differential between the positive DC electric power bus 20 and the negative DC electric power bus 30 ($\Delta$DC) is either invalid or below the threshold T1, the monitoring ends.

When the voltage differential between the positive DC electric power bus 20 and the negative DC electric power bus 30 ($\Delta$DC) is valid and is greater than the threshold T1, a first timer Y is incremented (Inc Y_cnt) (315). The voltage differential between the positive DC electric power bus 20 and the chassis ground 35 (DC+) and the voltage differential between the negative DC electric power bus 30 and the chassis ground 35 (DC−) are compared to a minimum voltage differential (Min_DC) to ensure that the values for DC+ and DC− are both positive and at least the minimum voltage differential, which is set as a default voltage of 1.0 volt (320). This prevents overflow due to near zero or negative readings.

An isolation ratio (Iso_Rat) is calculated as a ratio of the voltage differential between the negative DC electric power bus 30 and the chassis ground 35 (DC−) and the voltage differential between the positive DC electric power bus 20 and the chassis ground 35 (DC+), i.e., DC−/DC+(325).

The isolation ratio is compared to a first ratio threshold K1 (330). This first comparison is an indication of electrical resistance between the positive DC electric power bus 20 and the chassis ground 25. When the isolation ratio is greater than the first ratio threshold K1, the evaluation is complete, and a second timer X is incremented (Inc X_cnt) (335). This indicates a loss of isolation has occurred between positive DC electric power bus 20 and the chassis ground 35. Otherwise, the algorithm will start to check the isolation between the negative DC electric power bus 30 and the chassis ground 35. The isolation ratio will be compared to one of two threshold values depending on magnitude of the voltage differential between the positive DC electric power bus 20 and the negative DC electric power bus 30 to detect loss of isolation between the negative DC electric power bus 30 and the chassis ground 35. Selection of one of the two threshold values depends upon the magnitude of voltage differential between the positive DC electric power bus 20 and the negative DC electric power bus 30, and are chosen with sufficient margin between a "must not detect" loss of isolation condition and a "must detect" loss of isolation, determined using the calculated isolation ratio.

The voltage differential between the positive DC electric power bus 20 and the negative DC electric power bus 30 ($\Delta$DC) is compared to an isolation threshold voltage (Iso_V1), which is 100V in one embodiment (340). When the isolation threshold voltage (Iso_V1) is exceeded, the isolation ratio is compared to a second ratio threshold K2 (350). When the isolation threshold voltage (Iso_V1) is not exceeded, the isolation ratio is compared to a third ratio threshold K3 (345). When the isolation ratio is less than the selected one of the second and third ratio thresholds K2 and K3 respectively, the second timer X is incremented (Inc X_cnt) (355 and 360). Otherwise, the algorithm continues without incrementing the second timer X. The first timer Y and the second timer X are evaluated to see whether sufficient elapsed periods of time have passed (365). In one embodiment, the first timer Y has matured when it has reached 5.0 seconds and the second timer X has matured when it has reached 0.5 seconds. A report indicating the ground isolation is intact (Pass) or loss of a ground isolation fault (Fault) is communicated to the control module 10 for action (370). In one embodiment, the ground isolation is considered intact (Pass) when the isolation ratio is below the selected first threshold K1, and exceeds the selected one of the second and third ratio thresholds, K2 and K3 respectively during a substantial portion of the previous total elapsed Y seconds of monitoring, i.e., during X elapsed seconds of the previous total elapsed Y seconds. In one embodiment, this translates to 4.5 elapsed seconds of the previous total elapsed 5.0 seconds, or 90%. Otherwise, a ground isolation fault is indicated. In this manner a ground isolation fault associated with one of the positive DC electric power bus 20 and the negative DC electric power bus 30 can be detected.

Accurately detecting a ground isolation fault and accurately avoiding detecting a ground isolation fault when no ground isolation fault exists is required and drives accurate selection of the first, second, and third ratio thresholds K1, K2, and K3, respectively. To account for all the resistance paths that can affect ground isolation, ground isolations of all of the components of circuit 100 are considered. Factors affecting ground isolation and electrical resistance for each of the components are accounted for. Such factors include ambient and component temperatures, part-to-part variability and limit parts and their associated tolerance levels, circuit interface errors, measurement errors, and associated resistance variations relative to the chassis ground 35. Furthermore, there can be drift in electrical resistance associated with temperature, service life, high-voltage drift, and effect of soldering at various junctions. There can be a variation in isolation resistance associated with the inverter module 25 associated with stray capacitance and Y-capacitance leakage, which can has be as high as +/−0.5%. There is resistance tolerance associated with isolation resistances, sensing resistances or interface errors associated with sensing resistors and the A/D converter 48, and integrated circuits in the various components, in one embodiment as much as +/−0.65%. Other electric devices in the circuit, e.g., an air conditioning compressor module, an electrical heating module, a charging module, and wiring harnesses associated with positive and negative DC electric power buses may not have physical systems for isolation resistance, and therefore the isolation resistance can vary as much as +/−25%.

A simulation executed on an electric circuit model can be used to determine ground isolation resistance for a properly operating system taking into account scenarios that stack up or otherwise combine the ranges of tolerances of isolation and sensing resistance, variations in the inverter module isolation resistance with regard to the chassis ground, variations in isolation resistance of the other system components, and circuit interface errors. It is known in the art to generate electric circuit models and execute electrical simulations thereon.

Figure 3:
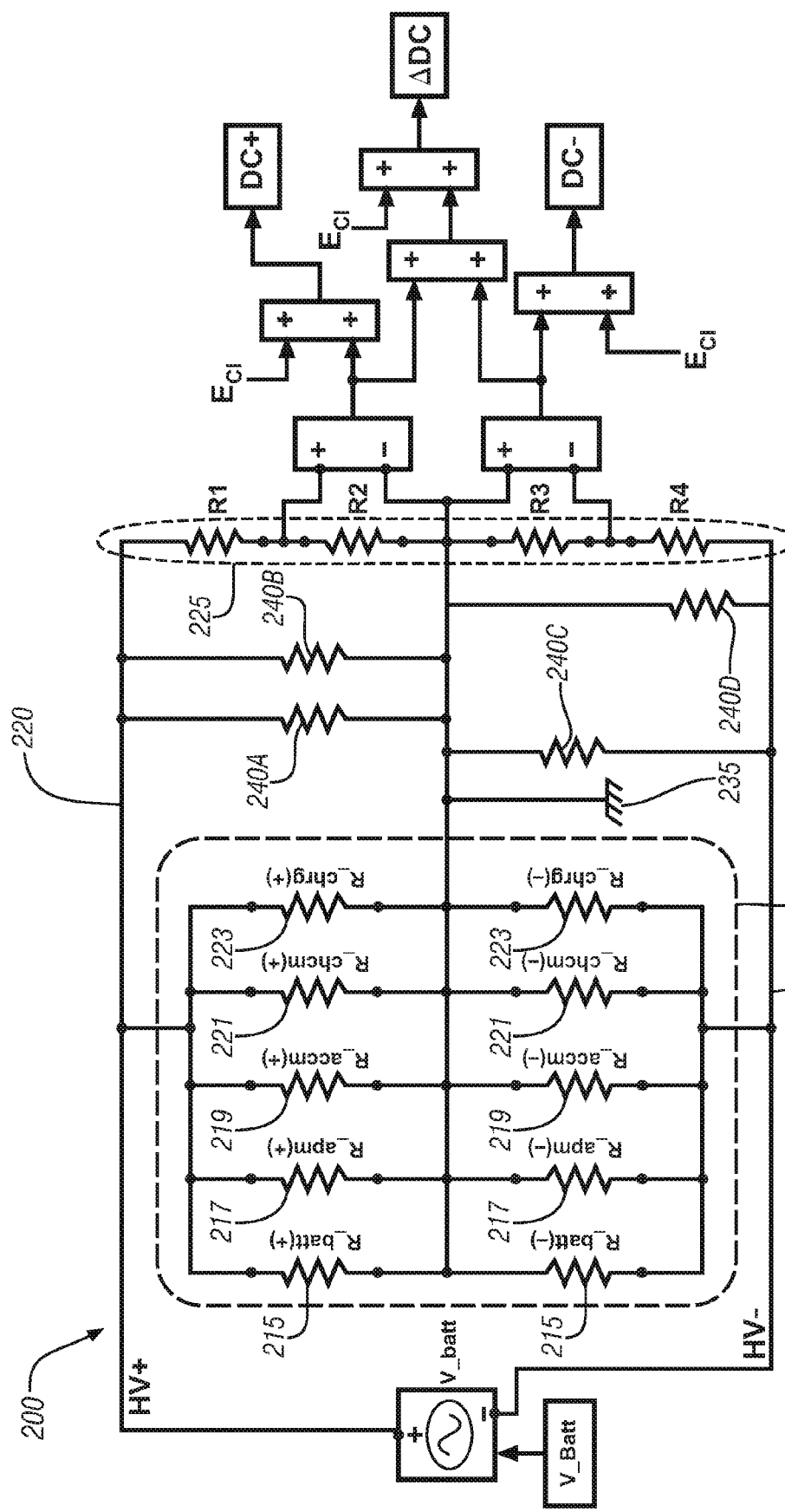
FIG. 3 depicts an electric circuit model of the electric circuit shown with reference to FIG. 1 that can be executed as part of an electrical simulation program in accordance with the present disclosure.

FIG. 3 depicts an exemplary electric circuit model 200 representing the electric circuit 100 shown with reference to FIG. 1. The electric circuit model 200 can be executed as part of an electrical simulation program that incorporates a simulated high-voltage energy storage device or battery pack (V_batt), simulated inverter module 225 and a simulated plurality of electric devices, designated as resistive circuit 210 electrically connected to a simulated positive DC electric power bus 220 (HV+), and a simulated negative DC electric power bus 230. Each of the electric devices that electrically connect between the positive DC electric power bus 220 and the negative DC electric power bus 230 is electrically isolated from a simulated chassis ground 235.

The simulated high-voltage energy storage device or battery pack (BP) 215 generates an input voltage V_Batt. The electric circuit model 200 and associated simulation ranges account for tolerances of isolation and sensing resistance, variations in the isolation resistance of the simulated inverter module 225, isolation resistance with regard to the chassis ground 235, variations in isolation resistance of the other system components, and circuit interface errors. The range of tolerances includes: variation in isolation resistance of the plurality of electric devices, depicted as resistive circuit 210 relative to the simulated chassis ground 235; variation in isolation resistance of the simulated inverter module 225, which occurs between both the negative DC electric power bus 230 relative to the simulated chassis ground 235, and the positive DC electric power bus 220 relative to the simulated chassis ground 235; variation in sensing resistance of the simulated inverter module 225 due to stray capacitance and Y-capacitance leakage; and circuit interface errors ($E_{CI}$).

The electric circuit model 200 includes a selected one of threshold resistances 240A, 240B, 240C, and 240D respectively. The first threshold resistance 240A corresponds to a minimum threshold ground isolation resistance between the positive DC electric power bus 220 and the simulated chassis ground 235. The third threshold resistance 240C corresponds to a minimum threshold ground isolation resistance between the simulated chassis ground 235 and the negative DC electric power bus 230. A ground resistance that is less than or equal to the minimum threshold ground isolation is required to be detected ("must detect") and identified as a ground isolation fault, whereas ground resistance that is greater than the minimum threshold of "must detect" resistance value but less than "must not detect" resistance value 240B or 240D, ground isolation may be detected and identified as a ground isolation fault, although such detection is not required. In one embodiment, the minimum threshold ground isolation is 500 Ω/V. A system operating at a nominal 420 V electrical potential must detect a ground isolation fault corresponding to 210 kΩ or below. Thus, the first and third threshold resistances 240A and 240C are set to 210 kΩ in one embodiment.

The second threshold resistance 240B corresponds to a second ground resistance threshold between the positive DC electric power bus 220 and the simulated chassis ground 235. The fourth threshold resistance 240D corresponds to a second ground resistance threshold between the simulated chassis ground 235 and the negative DC electric power bus 230. A ground resistance that is greater than the maximum threshold ground isolation is required to not be detected ("must not detect") and not identified as a ground isolation fault to prevent occurrence of a false positive ground isolation detection. In one embodiment, the electric circuit model 200 operating at the nominal 420 V must not detect a ground isolation fault when the ground resistance is a predetermined threshold of 500 KΩ or above. Thus, the second and fourth threshold resistances 240B and 240D are set to 500 kΩ in one embodiment. The resistance values are intended for illustrative purposes only.

The resistive circuit 210 includes electrical resistance of the plurality of electric devices that electrically connect in parallel between the positive DC electric power bus 220 and the simulated chassis ground 235, and the electrical resistance of the plurality of electric devices that electrically connect in parallel between the simulated chassis ground 235 and the negative DC electric power bus 230, including internal resistance of the battery pack (BP) 215.

The electrical ground isolation for each of the plurality of electric devices can be measured in terms of the electrical resistance between the positive DC electric power bus 220 and the simulated chassis ground 235, designated by (+), and the electrical resistance between the simulated chassis ground 235 and the negative DC electric power bus 230 designated by (−), for each of the electric devices. By way of example, the resistances can be quantified as in Table 1, below for the plurality of electric devices, which include in a non-limiting manner the battery pack (BP) having resistances R_batt(+) 215 and R_batt(−) 215, the inverter 225 having resistances R1, R2, R3 and R4, the auxiliary power module (APM) having resistances R_apm(+) 217 and R_apm(−) 217, the air conditioning compressor module (ACCM) having resistances R_accm(+) 219 and R_accm(−) 219, the electrical heating module (CHCM) having resistances R_chcm(+) 221 and R_chcm(−) 221, the charging module (CRG) having resistances R_chrg(+) 223 and R_chrg(−) 223, and wiring harnesses associated with the positive DC electric power bus 220 and the negative DC electric power bus 230. There can be imbalances between the electrical resistance between the positive DC electric power bus 220 and the simulated chassis ground 235, designated by (+), and the corresponding electrical resistance between the simulated chassis ground 235 and the negative DC electric power bus 230, designated by (−) for the electric devices.

TABLE 1

| Module | | Resistance (Ω) | Imbalance |
|---|---|---|---|
| TPIM | R1-R4 | 2.364 MΩ ≤ R ≤ 2.436 MΩ | Within +/− 1.5% |
| APM | R_apm | 50 MΩ ≤ R | No Restriction |
| BP | R_batt | 5.415 MΩ ≤ R ≤ 5.985 MΩ | Within +/− 5.0% |
| ACCM | R_accm | 50 MΩ ≤ R | No Restriction |
| CHCM | R_chcm | 50 MΩ ≤ R | No Restriction |
| CHARGE | R_chrg | 50 MΩ ≤ R | No Restriction |
| HV+, HV− | | 100 MΩ ≤ R | No Restriction |

The following are parameters and associated values used with execution of the simulation in one embodiment: input voltage V_Batt, which can range between 50V and 550V; variation in isolation resistances of the plurality of electric devices, designated as resistive circuit 210 varies +/−25%; variation in isolation resistance of the inverter module 225, which occurs between both the negative DC electric power bus 230 to ground 235, and the positive DC electric power bus 220 to ground 235, which varies +/−0.5%; variation in sensing resistance of the inverter module 225 due to stray capacitance and Y-capacitance leakage varies +/−0.5%; and circuit interface errors which vary +/−0.65%. Preferably the simulation of the electric circuit model 200 is executed with the electric circuit model 200 in a static condition, i.e., there are no discernible effects associated with alternating currents or voltages or other unaccounted transient inputs.

The simulation program is executed on the electric circuit model 200 to calculate the voltage differential between the positive DC electric power bus 220 and the simulated chassis ground 235 (DC+), the voltage differential between the negative DC electric power bus 230 and the simulated chassis ground 235 (DC−), and the voltage differential between the positive DC electric power bus 220 and the negative DC electric power bus 230 (ΔDC) over a predicted range of tolerances, the circuit interface errors, and over the range of input voltages V_Batt.

In one embodiment, the predicted range of inverter isolation and sensing resistance tolerances includes HV+ to chassis isolation resistance tolerances of +/−0.65%, HV− to chassis isolation resistance tolerances of +/−0.65%, HV+ to chassis sensing resistance tolerances of +/−0.65%, HV− to chassis sensing resistance tolerances of +/−0.65%, and circuit interface errors ($E_{CI}$). The input voltage V_Batt ranges from 50 V to 550 V in one embodiment.

The electric simulation program systematically calculates the voltage differentials DC+, DC−, and ΔDC across the electric circuit model 200. This includes iteratively varying the input voltage in a stepwise manner over the range of input voltages V_Batt, and iteratively varying the isolation resistances and interface resistances of the elements of the electric circuit model 200 in a stepwise manner over the predicted tolerance ranges. The predicted range of tolerances includes the aforementioned variation in isolation resistances of the plurality of electric devices, variation in sensing resistance of the inverter module 225 due to stray capacitance and Y-capacitance leakage, and circuit interface errors, and using a selected one of the threshold resistances 240A, 240B, 240C, and 240D. The iteratively calculated voltage differentials for DC+ and DC− are used to iteratively calculate the isolation ratio, i.e., (DC−)/(DC+).

The above-described simulation was used to evaluate ground isolation resistance between the positive DC electric power bus 220 and the simulated chassis ground 235 and ground isolation resistance between the simulated chassis ground 235 and the negative DC electric power bus 230.

With regard to the ground isolation resistance between the positive DC electric power bus 220 and the simulated chassis ground 235, in one embodiment a parametric value for a "must detect" threshold was within a range between 4.53 and 7.20 when the first threshold resistance 240A with minimum threshold ground isolation resistance between the positive DC electric power bus 220 and the simulated chassis ground 235 was used, taking into account the various factors. The corresponding parametric value for a "must not detect" threshold was within a range between 2.16 and 3.00 when the second threshold resistance 240B with the maximum threshold ground isolation between the positive DC electric power bus 220 and the simulated chassis ground 235 was used, taking into account the various factors. Thus, a statistically significant separation existed between the "must detect" threshold and the "must not detect" threshold. This separation was used to determine the first ratio threshold K1 described with reference to the control scheme depicted in FIG. 2 to detect ground isolation faults associated with the positive DC electric power bus 220 and the simulated chassis ground 235. In one embodiment, the first ratio threshold K1 was determined to be 4.53, taking into account the various factors.

With regard to the ground isolation resistance between the simulated chassis ground 235 and the negative DC electric power bus 230, in one embodiment a parametric value for a "must detect" threshold was within a range between 0.1 to 0.21 when the third threshold resistance 240C with minimum threshold ground isolation resistance between the simulated chassis ground 235 and the negative DC electric power bus 230 was used, taking into account the various factors. The corresponding parametric value for a "must not detect" threshold was within a range between 0.26 and 0.43 when the fourth threshold resistance 240D with the maximum threshold ground isolation between the simulated chassis ground 235 and the negative DC electric power bus 230 was used, taking into account the various factors. The separation between the maximum "must detect" threshold of 0.21 and the minimum "must not detect" threshold of 0.26 was not statistically significant. Further analysis indicated that the maximum "must detect" threshold of 0.21 and the minimum "must not detect" threshold of 0.26 both occurred at an input voltage V_Batt of 50V. At input voltages greater than 50V, there was sufficient separation between the "must detect" threshold of 0.21 and the "must not detect" threshold (0.33 minimum). When the input voltage V_Batt was 50 V, a loss of isolation requirement of 500 Ω/V translated to 25 kΩ, and when the input voltage V_Batt was 100 V, a loss of isolation requirement of 500 Ω/V translated to 50 kΩ. Therefore, the maximum "must detect" threshold was set at 0.16 for an input voltage V_Batt of 100V or less, and a maximum "must detect" threshold was set for 0.21 for an input voltage V_Batt of higher than 100V. The maximum "must detect" threshold 0.16 provided a sufficient margin between "must detect" and "must not detect" at 100V or less. The maximum "must detect" ratio 0.16 represented more than 50 kΩ isolation resistance at 100V whereas a loss of isolation needed to be detected at 50 kΩ for 100V DC bus voltage. This separation was used to determine the second and third ratio thresholds K2 and K3 described with reference to the control scheme depicted in FIG. 2 to detect ground isolation faults associated with the negative DC electric power bus 230.

Table 2 depicts exemplary data illustrative of the aforementioned simulation executed to calculate the isolation ratio using the scheme described with reference to FIG. 2 taking into account the aforementioned factors related to variations in isolation resistance in the circuit. The isolation ratio is calculated as a ratio of the voltage differential between the negative DC electric power bus 30 and the chassis ground 35 (DC−) and the voltage differential between the positive DC electric power bus 20 and the chassis ground 35 (DC+), i.e., DC−/DC+ for a range of input voltage V_Batt between 50V and 550V. The threshold resistances 240A, 240B, 240C, and 240D have been previously described.

The parameters and conditions, and associated values used in the simulation and depicted in Table 2 include:

Ratio Range, i.e., the maximum and minimum values of calculated isolation ratios associated with the simulation at the stated conditions;

V_Batt, i.e., input voltage: ranges between 50V and 550V;

Variation associated with other components: variation in isolation resistances of the plurality of electric devices designated as resistive circuit 210, which include a first component (Pos-to-Chassis) between the positive DC electric power bus 220 and ground 235, and second component (Neg-to-Chassis) between the negative DC electric power bus 230 and ground 235, with values of Pos-to-Chassis=+25% and Neg-to-Chassis=−25%;

Variation associated with the isolation resistance tolerance of the inverter module 225 (R_Iso_Tol), which occurs between both the negative DC electric power bus 230 to ground 235 (Neg-to-Chassis), and the positive DC electric power bus 220 to ground 235 (Pos-to-Chassis);

Variation associated with the sensing resistance tolerance of the inverter module 225 (R_Sense_Tol) due to stray capacitance and Y-capacitance leakage, which occurs between both the negative DC electric power bus 230 to ground 235 (Neg-to-Chassis), and the positive DC electric power bus 220 to ground 235 (Pos-to-Chassis); and Circuit interface errors (Circuit IF error) which varies +/−0.65%, and is one of a positive (Pos) and a negative (Neg) error. The simulation of the electric circuit model 200 was executed with the electric circuit model 200 in a static condition.

T=able 3 is analogous to Table 2, and depicts exemplary data illustrative of the aforementioned simulation executed to calculate the isolation ratio using the scheme described with reference to FIG. 2 taking into account factors related to variations in isolation resistance in the circuit. The isolation ratio is calculated as a ratio of the voltage differential between the negative DC electric power bus 30 and the chassis ground 35 (DC−) and the voltage differential between the positive DC electric power bus 20 and the chassis ground 35 (DC+), i.e., DC−/DC+ for a range of input voltages V_Batt between 50V and 550V. The threshold resistances 240A, 240B, 240C, and 240D have been previously described.

The parameters and associated values used in the simulation and depicted in Table 3 that differ from those used in Table 2 include: Variation in other components: variation in isolation resistances of the plurality of electric devices designated as resistive circuit 210, which include a first component (Pos-to-Chassis) between the positive DC electric power bus 220 and ground 235, and second component (Neg-to-Chassis) between the negative DC electric power bus 230 and ground 235, with values of Pos-to-Chassis=−25% and Neg-to-Chassis=+25%.

TABLE 2

| | Conditions (Voltage Sensing at TPIM) | |
|---|---|---|
| Other components:<br>Pos-to-Chassis = +25%<br>Neg-to-Chassis = −25% | Ratio Range<br>Must Detect<br>(≤210 kΩ) | Ratio Range<br>Must Not Detect<br>(≥500 kΩ) |
| Neg-to-Chassis Condition<br>R_Iso_Tol = −0.65%; R_Sense_Tol = +0.65%<br>Pos-to-Chassis Condition<br>R_Iso_Tol = −0.65%; R_Sense_Tol = +0.65%<br>Circuit IF error = Pos | 5.23 (at 50 V)<br>to<br>6.78 (at 550 V) | 2.55 (at 50 V)<br>to<br>2.82 (at 550 V) |
| Neg-to-Chassis Condition<br>R_Iso_Tol = −0.65%; R_Sense_Tol = +0.65%<br>Pos-to-Chassis Condition<br>R_Iso_Tol = −0.65%; R_Sense_Tol = +0.65%<br>Circuit IF error = Neg | 4.55 (at 50 V)<br>to<br>6.55 (at 550 V) | 2.16 (at 50 V)<br>to<br>2.68 (at 550 V) |
| Neg-to-Chassis Condition<br>R_Iso_Tol = +0.65%; R_Sense_Tol = −0.65%<br>Pos-to-Chassis Condition<br>R_Iso_Tol = +0.65%; R_Sense_Tol = −0.65%<br>Circuit IF error = Pos | 5.24 (at 50 V)<br>to<br>6.83 (at 550 V) | 2.56 (at 50 V)<br>to<br>2.84 (at 550 V) |
| Neg-to-Chassis Condition<br>R_Iso_Tol = −0.65%; R_Sense_Tol = −0.65%<br>Pos-to-Chassis Condition<br>R_Iso_Tol = +0.65%; R_Sense_Tol = +0.65%<br>Circuit IF error = Neg | 4.53 (at 50 V)<br>to<br>6.49 (at 550 V) | 2.15 (at 50 V)<br>to<br>2.68 (at 500 V) |
| Neg-to-Chassis Condition<br>R_Iso_Tol = +0.65%; R_Sense_Tol = +0.65%<br>Pos-to-Chassis Condition<br>R_Iso_Tol = −0.65%; R_Sense_Tol = −0.65%<br>Circuit IF error = Pos | 5.25 (at 50 V)<br>to<br>6.83 (at 550 V) | 2.56 (at 50 V)<br>to<br>2.84 (at 550 V) |
| Neg-to-Chassis Condition<br>R_Iso_Tol = +0.65%; R_Sense_Tol = +0.65%<br>Pos-to-Chassis Condition<br>R_Iso_Tol = −0.65%: R_Sense_Tol = −0.65%<br>Circuit IF error = Neg | 4.55 (at 50 V)<br>to<br>6.54 (at 550 V) | 2.16 (at 50 V)<br>to<br>2.7 (at 500 V) |

TABLE 3

| Other components:<br>Pos-to-Chassis = +25%<br>Neg-to-Chassis = −25% | Conditions (Voltage Sensing at TPIM) | |
|---|---|---|
| | Ratio Range<br>Must Detect<br>(≤210 kΩ) | Ratio Range<br>Must Not Detect<br>(≥500 kΩ) |
| Neg-to-Chassis Condition<br>R_Iso_Tol = −0.65%; R_Sense_Tol = +0.65% to<br>Pos-to-Chassis Condition<br>R_Iso_Tol = −0.65%; R_Sense_Tol = +0.65%<br>Circuit IF error = Pos | 0.21 (at 50 V)<br>to<br>0.17 (at 550 V) | 0.42 (at 50 V)<br>to<br>0.38 (at 550 V) |
| Neg-to-Chassis Condition<br>R_Iso_Tol = −0.65%; R_Sense_Tol = +0.65%<br>Pos-to-Chassis Condition<br>R_Iso_Tol = −0.65%; R_Sense_Tol = +0.65%<br>Circuit IF error = Neg | 0.10 (at 50 V)<br>to<br>0.12 (at 550 V) | 0.27 (at 50 V)<br>to<br>0.33 (at 550 V) |
| Neg-to-Chassis Condition<br>R_Iso_Tol = +0.65%; R_Sense_Tol = −0.65%<br>Pos-to-Chassis Condition<br>R_Iso_Tol = +0.65%; R_Sense_Tol = −0.65%<br>Circuit IF error = Pos | 0.21 (at 50 V)<br>to<br>0.17 (at 550 V) | 0.42 (at 50 V)<br>to<br>0.38 (at 550 V) |
| Neg-to-Chassis Condition<br>R_Iso_Tol = −0.65%; R_Sense_Tol = −0.65%<br>Pos-to-Chassis Condition<br>R_Iso_Tol = +0.65%; R_Sense_Tol = +0.65%<br>Circuit IF error = Neg | 0.10 (at 50 V)<br>to<br>0.12 (at 500 V) | 0.27 (at 50 V)<br>to<br>0.33 (at 550 V) |
| Neg-to-Chassis Condition<br>R_Iso_Tol = +0.65%; R_Sense_Tol = +0.65%<br>Pos-to-Chassis Condition<br>R_Iso_Tol = −0.65%; R_Sense_Tol = −0.65%<br>Circuit IF error = Pos | 0.21 (at 50 V)<br>to<br>0.17 (at 550 V) | 0.43 (at 50 V)<br>to<br>0.39 (at 550 V) |
| Neg-to-Chassis Condition<br>R_Iso_Tol = +0.65%; R_Sense_Tol = +0.65%<br>Pos-to-Chassis Condition<br>R_Iso_Tol = −0.65%: R_Sense_Tol = −0.65%<br>Circuit IF error = Neg | 0.10 (at 50 V)<br>to<br>0.12 (at 550 V) | 0.27 (at 50 V)<br>to<br>0.33 (at 550 V) |

The ranges of isolation ratios are used to determine allowable thresholds for a "must not detect" loss of isolation condition and a "must detect" loss of isolation associated with the isolation ratio, i.e., DC−/DC+, having a sufficient margin of separation therebetween.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. A control module-implemented method for monitoring electrical isolation of a DC electrical power circuit relative to a chassis ground, the method comprising:
   monitoring a first electrical potential comprising a voltage differential between a positive DC electric power bus and a negative DC electric power bus;
   monitoring a second electrical potential comprising a voltage differential between the positive DC electric power bus and the chassis ground;
   monitoring a third electrical potential comprising a voltage differential between the negative DC electric power bus and the chassis ground;
   calculating a first voltage ratio comprising employing a control module to calculate a ratiometric comparison of the third electrical potential to the second electrical potential;
   monitoring electrical isolation between the positive DC electric power bus and the chassis ground based upon the first voltage ratio; and
   monitoring electrical isolation between the negative DC electric power bus and the chassis ground in relation to the first voltage ratio and the first electrical potential.

2. The method of claim 1, further comprising detecting a fault associated with the electrical isolation between the positive DC electric power bus and the chassis ground when the first voltage ratio exceeds a predetermined ratio threshold.

3. The method of claim 2, wherein the first ratio threshold corresponds to a voltage threshold associated with an electrical resistance between the positive DC electric power bus and the chassis ground of 500Ω per volt of the first electrical potential.

4. The method of claim 2:
   wherein the first, second and third electrical potentials are iteratively monitored over an elapsed period of time;
   wherein the first voltage ratio are iteratively calculated over the elapsed period of time; and
   wherein detecting the fault associated with the electrical isolation between the positive DC electric power bus and the chassis ground when the first voltage ratio exceeds the first ratio threshold comprises detecting the fault associated with the electrical isolation between the positive DC electric power bus and the chassis ground when the first voltage ratio exceeds the first ratio threshold during a predetermined portion of the elapsed period of time.

5. The method of claim 4, further comprising detecting intact electrical isolation between the positive DC electric power bus and the chassis ground when the first voltage ratio does not exceed than the predetermined ratio threshold during a predetermined portion of the elapsed period of time.

6. The method of claim 1, further comprising detecting a fault associated with the electrical isolation between the negative DC electric power bus and the chassis ground when the first voltage ratio is less than a first ratio threshold and the first electrical potential is greater than an isolation threshold voltage.

7. The method of claim 6, further comprising detecting a fault associated with the electrical isolation between the negative DC electric power bus and the chassis ground when the first voltage ratio is less than a second ratio threshold and the first electrical potential is less than the isolation threshold voltage.

8. The method of claim 7, wherein the first and second ratio thresholds each correspond to a voltage threshold associated with an electrical resistance between the negative DC electric power bus and the chassis ground of 500Ω per volt of the first electrical potential.

9. The method of claim 7:
wherein the first, second and third electrical potentials are iteratively monitored over an elapsed period of time;
wherein the first voltage ratio is iteratively calculated over the elapsed period of time; and
wherein detecting the fault associated with the electrical isolation between the negative DC electric power bus and the chassis ground when the first voltage ratio is less than the first ratio threshold and the first electrical potential is greater than the isolation threshold voltage comprises detecting the fault associated with the electrical isolation between the negative DC electric power bus and the chassis ground when the first voltage ratio is less than the first ratio threshold and the first electrical potential is greater than the isolation threshold voltage during a predetermined portion of the elapsed period of time.

10. The method of claim 9, wherein detecting the fault associated with the electrical isolation between the negative DC electric power bus and the chassis ground when the first voltage ratio is less than the second ratio threshold and the first electrical potential is less than the isolation threshold voltage comprises detecting the fault associated with the electrical isolation between the negative DC electric power bus and the chassis ground when the first voltage ratio is less than the second ratio threshold and the first electrical potential is less than the isolation threshold voltage during a predetermined portion of the elapsed period of time.

11. A control module-implemented method for monitoring electrical isolation between a DC electrical power circuit and an electric ground, the DC electrical power circuit including an electric energy storage device electrically connected via a positive DC electric power bus and a negative DC electric power bus to an electric power inverter device, the method comprising:
monitoring a first potential comprising a voltage differential between the positive DC electric power bus and the negative DC electric power bus;
monitoring a second potential comprising a voltage differential between the positive DC electric power bus and the electric ground;
monitoring a third potential comprising a voltage differential between the negative DC electric power bus and the electric ground;
calculating a first voltage ratio comprising employing a control module to calculate a ratio of the third potential and the second potential;
detecting a fault associated with electrical isolation between the positive DC electric power bus and the electric ground when the first voltage ratio exceeds a first ratio threshold;
detecting a fault associated with electrical isolation between the negative DC electric power bus and the electric ground when the first voltage ratio is less than a second ratio threshold and the first potential is greater than an isolation threshold voltage; and
detecting a fault associated with electrical isolation between the negative DC electric power bus and the electric ground when the first voltage ratio is less than a third ratio threshold and the first potential is less than the isolation threshold voltage, wherein the third ratio threshold is less than the second ratio threshold.

12. The method of claim 11, further comprising:
modeling the DC electrical power circuit comprising the electric energy storage device electrically connected via the positive DC electric power bus and the negative DC electric power bus to the electric power inverter device and electric ground, and a selected threshold resistor electrically connected between the electric ground and one of the positive DC electric power bus and the negative DC electric power bus;
identifying tolerance ranges corresponding to isolation resistances and interface resistances of elements of the DC electrical power circuit model;
executing a simulation of the DC electrical power circuit model;
determining one of the first, second and third ratio thresholds based upon the executed simulation of the DC electrical power circuit model and the selected threshold resistor.

13. The method of claim 12, wherein executing the simulation of the DC electrical power circuit model comprises:
iteratively calculating the first, second and third potentials using the DC electrical power circuit model with an input voltage associated with the electric energy storage device varying in a stepwise manner over a range of input voltages and isolation resistances and interface resistances of the elements of the DC electrical power circuit model varying in a stepwise manner over the identified tolerance ranges; and
iteratively calculating an isolation ratio for each of the iteratively calculated first, second and third potentials comprising calculating a ratio of the third potential and the second potential.

14. The method of claim 13, wherein determining the first ratio threshold based upon the executed simulation of the DC electrical power circuit model and the selected threshold resistor comprises: selecting a minimum of the calculated isolation ratios for the iteratively calculated first, second and third potentials when the selected threshold resistor corresponds to an electrical resistance between the positive DC electric power bus and the electric ground of 500Ω per volt of the first electrical potential.

15. The method of claim 13, wherein determining the second ratio threshold based upon the executed simulation of the DC electrical power circuit model and the selected threshold resistor comprises selecting a minimum of the calculated isolation ratios for the iteratively calculated first, second and third potentials when the selected threshold resistor corresponds to an electrical resistance between the negative DC electric power bus and the electric ground of 500Ω per volt of the first electrical potential and the first electrical potential is greater than an isolation threshold voltage.

16. The method of claim 13, wherein determining the second ratio threshold based upon the executed simulation of the DC electrical power circuit model and the selected threshold resistor comprises selecting a minimum of the calculated isolation ratios for the iteratively calculated first, second and third potentials when the selected threshold resistor corresponds to an electrical resistance between the negative DC electric power bus and the electric ground of 500Ω per volt of the first electrical potential and the first electrical potential is less than an isolation threshold voltage.

* * * * *